United States Patent

Kunz et al.

[15] 3,650,744

[45] Mar. 21, 1972

[54] ETCHING METHOD USING PHOTOPOLYMERIZABLE VAPORS AS THE PHOTORESIST

[72] Inventors: Charles O. Kunz, Ballston Lake; Parley C. Long, Bridgewater, both of N.Y.

[73] Assignee: General Electric Company

[22] Filed: Mar. 2, 1970

[21] Appl. No.: 15,678

[52] U.S. Cl. ....................96/35.1, 96/36

[51] Int. Cl. ....................G03c 5/00

[58] Field of Search ....................96/35.1, 36; 117/93.31

[56] References Cited

UNITED STATES PATENTS

| | | | |
|---|---|---|---|
| 3,522,076 | 7/1970 | Wright | 117/93.31 |
| 3,522,226 | 7/1970 | Wright | 117/93.31 |
| 3,321,309 | 5/1967 | Reichel | 96/36 |
| 3,188,211 | 6/1965 | Kocsuta | 96/36 |
| 3,013,956 | 12/1961 | Hugle et al. | 96/36 |
| 3,346,384 | 10/1967 | Gaynor | 96/36 |
| 2,892,712 | 6/1959 | Plambeck | 96/48 |
| 3,097,097 | 7/1963 | Oster et al. | 96/30 |

*Primary Examiner*—Norman G. Torchin
*Assistant Examiner*—Edward C. Kimlin
*Attorney*—Richard R. Brainard, Joseph T. Cohen, Paul A. Frank, Charles T. Watts, William A. Teoli, Frank L. Neuhauser, Oscar B. Waddell and Joseph B. Forman

[57] ABSTRACT

An etching method is provided utilizing an organic solvent soluble photosensitive photopolymerized organic film on the surface of an etchable substrate as a negative photoresist. The organic film is applied by effecting the ultraviolet surface photopolymerization of a photopolymerizable organic material in vaporous form, such as hexachlorobutadiene at substrate temperatures below about 100° C. The method allows for the production of composites having continuous and imperforate films having thicknesses as low as 500 Angstroms, which can be employed as negative photoresists and also provide dielectric layers.

8 Claims, 8 Drawing Figures

Inventors:
Charles O. Kunz,
Parley C. Long,
by William A. Teoli
Their Attorney.

Inventors:
Charles O. Kunz,
Parley C. Long,
by William A. Teoli
Their Attorney.

ETCHING METHOD USING PHOTOPOLYMERIZABLE VAPORS AS THE PHOTORESIST

The present invention relates to a method of etching a substrate utilizing a negative photoresist derived from a photosensitive photopolymerized organic film.

Prior to the present invention, various substrates were readily etched in a patterned manner using a photoresist to protect specific areas of the substrate. Generally, a preformed photosensitive organic polymer was initially applied onto the surface of the substrate by such techniques as spinning or dip-coating. After the polymer was applied, a mask was placed on top of the film and the substrate was placed in an exposure station. The substrate was then exposed to insolubilize the film in a patterned manner. A wash step was then employed to develop the substrate. A photoresist remained on the substrate to allow for the etching of the substrate to a desired configuration, leaving a negative of the mask etched into the substrate upon removal of the photoresist.

Although such dip-coated or spun photosensitive preformed organic polymers can provide satisfactory mask reproductions, the use of such photosensitive polymers often does not allow for the employment of high resolution masks. Dip-coating or spinning techniques are generally limited to the production of films having thicknesses of greater than 2,000 Angstroms to minimize the effect of film discontinuities due to the presence of the foreign matter, such as dust which can be picked up. The development of microelectronic printed circuits also has increased the need for techniques for depositing photosensitive materials which can be employed in combination with high resolution masks requiring pinhole free films having uniform thicknesses of 1,000 Angstroms or less. In most cases, preformed photosensitive polymers applied by dip-coating or spinning are not suitable as dielectric or insulating layers. It also is difficult to control the uniformity and thickness of films made from preformed organic polymers.

The present invention is based on the discovery that continuous imperforate photosensitive organic films soluble in a variety of organic solvents can be deposited on various substrates at thicknesses as low as 500 Angstroms by effecting the surface photopolymerization of a photopolymerizable organic monomer in vaporous form at substrate temperatures below 100° C. and at pressures below about 10 torr. The thickness of the film is controlled by varying the deposition time. The films made in accordance with the invention are continuous, imperforate, adherent and uniform, and can be employed as photoresists, and subsequently removed, or can be retained on the substrate as dielectric films or insulators.

There is provided by the present invention, a method for etching a substrate which comprises (1) effecting the deposition of an organic solvent soluble organic film onto the surface of the substrate to produce an organic film-substrate composite, (2) exposing a portion of the organic solvent soluble organic film to ultraviolet light rendering such exposed portions, insoluble in such organic solvent, (3) treating the organic film-substrate composite with organic solvent to effect the removal of soluble organic film, and (4) etching the exposed substrate surface with a chemical etchant, which involves the improvement of effecting the deposition of the organic solvent soluble film of step (1) onto the surface of the substrate by photopolymerizing a photopolymerizable organic monomer in vaporous form on the surface of the substrate at a surface temperature below 100° C. utilizing ultraviolet light at a wavelength of from about 1,800 Angstroms to 3,500 Angstroms.

Photopolymerizable organic monomers which can be utilized in the practice of the invention include dienes such as butadiene, hexachlorobutadiene, hexafluorobutadiene, 2,5-dimethyl-2,4-hexadiene, etc. In addition to these dienes, other organic monomers suitable for surface photopolymerization which can be utilized are, for example, acrylonitrile, methylmethacrylate, 1,5-hexadiene, phenol, styrene, etc. It has been found generally that organic monomer can be employed which can be surface photopolymerized at pressures below about 10 torr without undue formation of gas phase polymer, or "floc."

Methods for forming continuous films by the ultraviolet surface photopolymerization of various organic photopolymerizable materials in vaporous form are shown in the copending applications of A. N. Wright, Ser. No. 530,971, now U.S. Pat. No. 3,522,226 filed Mar. 1, 1966, and A. N. Wright, Ser. No. 618,132, now U.S. Pat. No. 3,522,076, filed Feb. 23, 1967, and assigned to the same assignee as the present invention. These applications disclose methods for making thin organic films by the surface photopolymerization of a variety of photopolymerizable organic materials, etc., utilizing ultraviolet light at a wavelength of less than about 3,500 Angstroms at a pressure of up to about 8 torr.

The foregoing description of other features and advantages of the present invention will be apparent in the following and more particular description of preferred embodiments of the invention as illustrated in the drawings.

Figure 2:
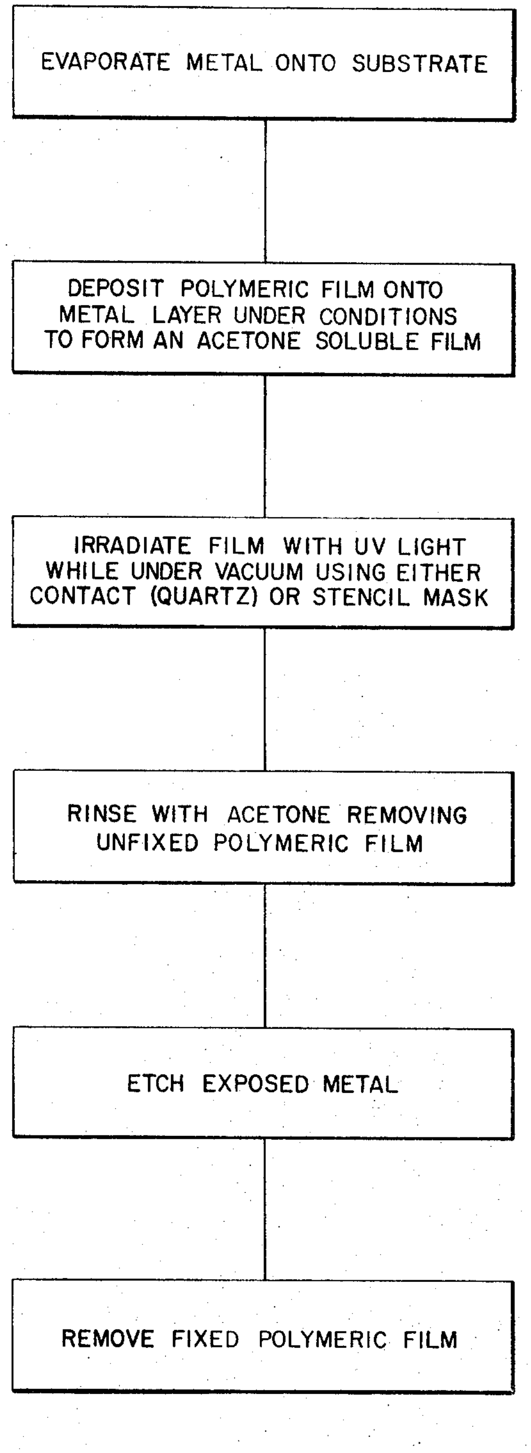
FIG. 2 is a flow chart describing some of the preferred ways in which the method of the invention can be practiced.
Figure 3:
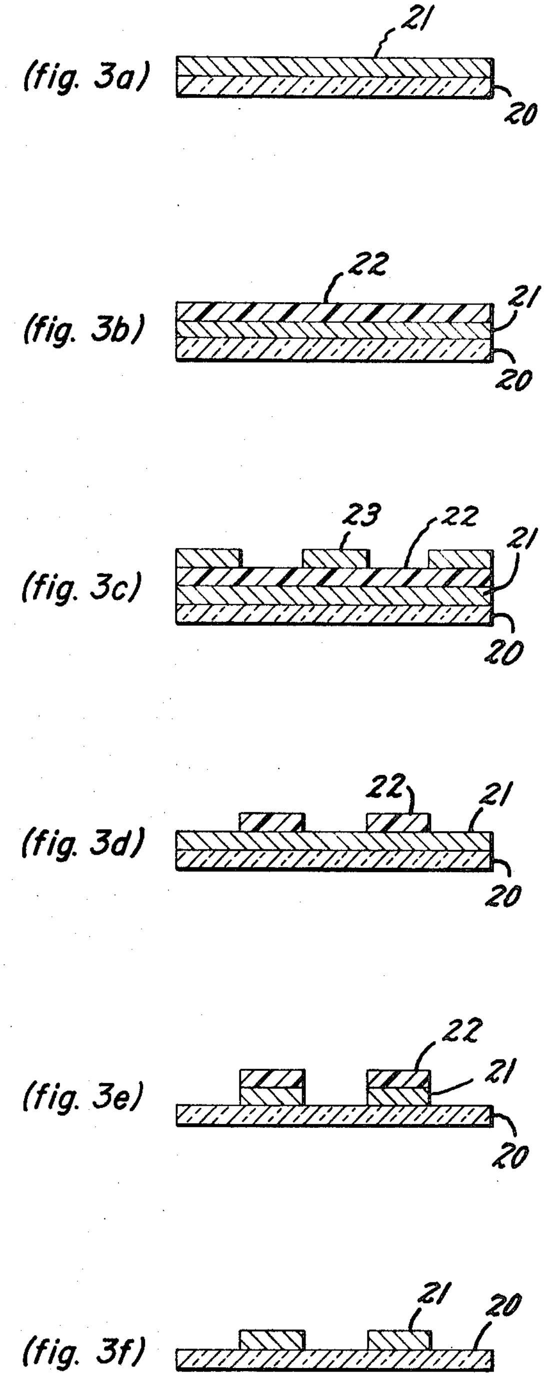

FIG. 3 adjoining FIG. 2 shows sectional views of the description of FIG. 2.

Figure 1:
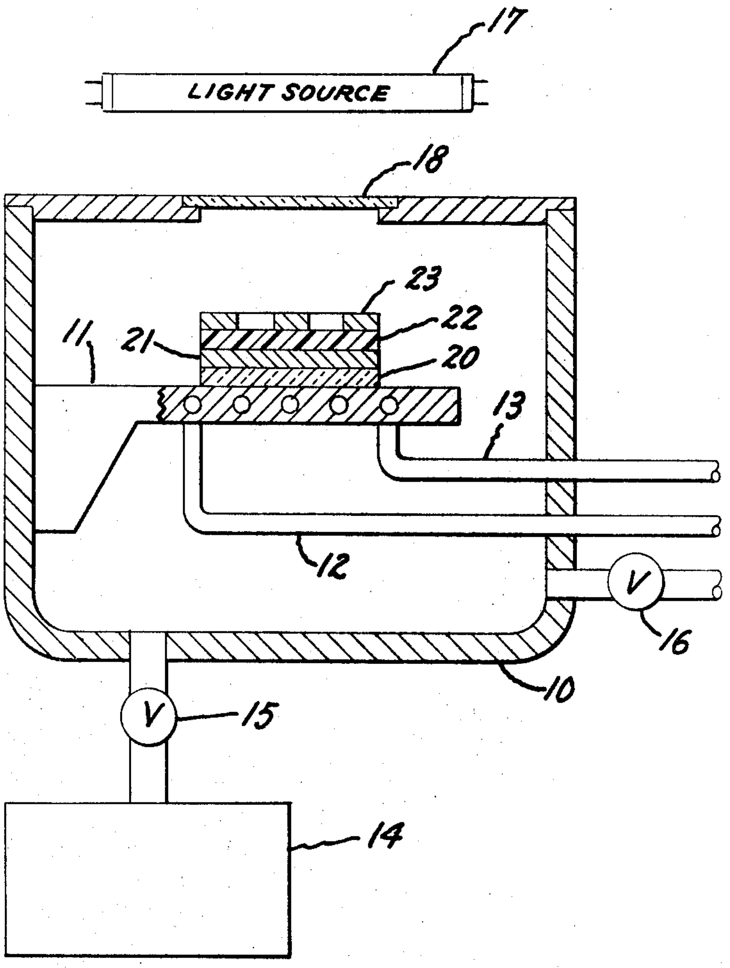
FIG. 1 illustrates an apparatus useful in practicing the method of the invention such as an evacuated chamber.

There is shown in FIG. 1 a chamber 10 having a water cooled block 11 and ducts 12 and 13. A vacuum pump chamber 14 can provide for the evacuation of chamber 10 through valve 15. Valve 16 allows for the introduction of vaporous organic photopolymerizable materials. A lamp 17 is used to effect the formation and exposure of organic film by light transmission through window 18.

On cooling block 11, there is shown substrate 20 such as glass onto which a metal layer 21 such as aluminum can be evaporated. A soluble photosensitive organic film 22 can be formed on the surface of the aluminum in accordance with the invention. There also is shown a mask 23 making up the composite 20–23 which upon exposure to ultraviolet light while in vacuum effects the insolubility of the photosensitive organic polymeric film in a configurational manner.

FIG. 2 shows a flow chart illustrating the practice of the invention. A metal, for example aluminum, copper, gold, etc., is evaporated onto a substrate to produce a composite of the metal and the substrate. Suitable substrates which can be employed are glass, plastics such as polyethyleneterephthalate, silicon, etc. In instances where silicon is employed, a silicon oxide coating can serve as the etchable substrate in place of the aforementioned evaporated metal.

The metal-substrate composite is then placed into an evacuated chamber as shown in FIG. 1. An organic monomer such as hexachlorobutadiene is introduced at a pressure between about 0.05 to 10 torr. An ultraviolet light source is then employed emitting light at wavelengths between 1,800 Angstroms to 3,500 Angstroms. The surface of the substrate is maintained at temperatures below 100° C. and preferably between 25° C. to 80° C. Depending upon such factors as intensity of the light, the vapor pressure of the organic monomer and the temperature of the substrate, satisfactory organic solvent soluble film can be formed at a rate of about at least 10 to 1,000 Angstroms per minute and preferably about 100 Angstroms per minute. Uniform films of desired thickness are obtained by controlling the deposition time.

The resulting composite consisting of the organic film and the intermediate metal layer of the substrate can then be removed from the evacuated chamber and stored under atmospheric conditions and normal room lighting for an extended period of time such as several years or more.

The aforementioned composite can be employed in the etching method of the invention by placing it into an evacuated chamber employing a suitable contact or stencil mask having a desired configuration. The chamber can then be evacuated or an inert gas can be used to purge the chamber of any residual oxygen. The substrate can then be exposed with ultraviolet light at a wavelength previously indicated for a period of about 5 minutes. Longer or shorter exposure times can be employed depending upon such factors such as the type of film, the thickness of the film, the intensity of the light, etc.

After the film has been exposed, the composite can be washed with a suitable organic solvent such as acetone by dipping the composite into an acetone bath, by employing an acetone spray, etc. Suitable organic solvents in addition to acetone can be employed such as aromatic hydrocarbons, chlorinated aromatic hydrocarbons, for example xylene, toluene, chlorobenzene, etc.

After the above wash step, the substrate then can be etched with a suitable etchant by well-known methods. Among the etching solutions which can be employed, there are, for example:

A copper etchant employing any of the following solutions: (1) a ferric chloride solution which is between 2.25 and 3.75 molar can be employed at temperatures of from 32° to 50° C.; (2) a solution of ammonium persulfate, 2 pounds per 1 gallon of water to which has been added 1 milliliter of a mercuric chloride solution produced by dissolving 26.7 grams of solid mercuric chloride in 1 liter of water and the etching carried out at 35° to 50° C.

Aluminum can be etched employing: (1) a 5 normal potassium hydroxide solution (100 milliliters) and potassium bromate (44 grams); (2) employing hydrochloric acid and copper carbonate; (3) subjecting an aluminum substrate to a bath containing 10 grams of stannous chlorate and enough water to make 500 cc. and subsequently subjecting the aluminum substrate to an etchant comprising hydrochloric acid (concentrated) 1 part by volume, nickelous chloride sufficient to turn solution light green, and water from 4 to 6 parts by volume; or (4) one could employ an aqueous alkaline etching solution containing 20 percent sodium hydroxide at 60° C. to 90° C.

A tin substrate can be etched, for example, by employing a solution of 50 cc. of hydrochloric acid, 100 cc. of nitric acid and 850 cc. of water.

A lead substrate can be etched employing as an etchant either:

1. a solution containing 200 cc. of citric acid, 300 cc. of hydrogen peroxide and 500 cc. of water; or 2. a solution of 200 cc. of acetic acid, 50 cc. of hydrogen peroxide and 750 cc. of water.

It will, of course, be obvious to those skilled in the arts that other etching solutions can be employed in the process of this invention for the various metal or metal oxide substrates, for example silicon dioxide, which also can be etched. The particular etching bath will be dependent upon the desired speed of etching, the temperature of etching and the like, which will be well understood by those skilled in the art.

The resulting etched substrate described above can be employed with or without the residual fixed organic polymeric film depending upon the application desired. In instances where the film is removed, several methods can be employed including those described in copending application RD-2982, filed Dec. 1969, Ser. No. 888,380, assigned to the same assignee as the present invention. In addition, standard methods can be used such as soaking in organic solvents for extended periods of time combined with a scraping and mechanical attrition or by the "Asher Method" utilizing oxygen at elevated temperature. In instances where the organic polymeric film is retained on the substrate, the film can be employed as an insulator or as a dielectric for microelectronic circuit components.

In order that those skilled in the art will be better able to practice the invention, the following examples can be given by way of illustration and not by way of limitation:

EXAMPLE 1

A glass substrate having dimensions of 1×3×1/20 inch and having an evaporated gold layer at a thickness of about 4,000 Angstroms was placed into an evacuated chamber as illustrated by FIG. 1. Hexachlorobutadiene was introduced at a pressure of about 0.1 torr. While the substrate was maintained at a temperature between 40° and 50° C. employing a water cooled block as a support for the substrate, the substrate was exposed to a 700-watt medium pressure mercury arc lamp situated about 9 cm. from the substrate. A surface photopolymerized film was deposited at a rate of about 100 Angstroms per minute.

After about 5 minutes, the substrate was removed from the evacuated chamber. It was found that the film on the substrate was about 500 Angstroms thick. The thickness of the film was established by measuring its capacitance utilizing the mercury drop technique as described by S. Whitehead, *Dielectric Breakdown of Solids*, Oxford Clarendon Press (1951) page 9. In addition to being imperforate and exhibiting satisfactory dielectric and insulating properties, the film was found to be soluble in acetone.

Additional organic film-evaporated gold composites were made by the same photopolymerization technique. These composites were stored under atmospheric conditions and normal room lighting. One of these composites was placed in the vacuum chamber and a quartz contact mask having a pattern with lines 6 microns wide, was placed on top of the substrate. The chamber was then evacuated and exposed to ultraviolet light utilizing the 700-watt mercury lamp previously described for a period of about 5 minutes. The substrate was then removed from the chamber and immersed in an acetone bath for a period of 30 seconds at a temperature of 25° C. Upon removing the substrate from the bath, there was obtained an evaporated gold-glass composite having a pattern of organic film on top of the evaporated gold with the same 6-micron wide lines as shown by the contact mask in the form of a negative photoresist.

The composite was then treated with a gold etch (200 gm. KI and 60 gm. $I_2$ in 1 liter aqueous solution) for 2 minutes. The exposed gold was dissolved and microscopic examination (500X magnification) showed that the mask pattern was negatively reproduced with high fidelity indicating resolution to 1 micron.

The substrate is then placed under a 700-watt ultraviolet mercury lamp at a distance of about 3 cm. from the lamp. The lamp is operated at its rated capacity producing a flux of about 5 watts/cm.$^2$ on the surface of the substrate in the effective wavelength region of about 1,800–3,500 Angstroms. The temperature of the substrate during ultraviolet irradiation is about 230° C. and the average rate of removal of organic film under these conditions is about 50 Angstroms/min. This manner of film removal is in accordance with the method taught in copending application of A. N. Wright and R. C. Merrill (Docket RD-2982) Serial No. 888,380, filed Dec. 29, 1969 and assigned to the same assignee as the present invention.

EXAMPLE 2

A silicon wafer with about 1 micron of copper evaporated onto the surface was placed in a vacuum chamber similar to that shown in FIG. 1 and the chamber evacuated to about $10^{-3}$ torr. The system was then closed off to the vacuum pump and opened to a vessel containing butadiene which was thermostated with a mixture of dry ice and acetone producing a butadiene vapor pressure of about 6.5 torr. The substrate was then irradiated with ultraviolet light using a 700-watt mercury lamp positioned about 9 cm. from the substrate. The average temperature of the surface of the substrate during the irradiation was maintained at about 30° C. using a cooling block which supported the substrate. The substrate was irradiated for 5 minutes forming an acetone soluble photopolymerized film on the substrate having a thickness of about 500 Angstroms. A stencil mask having 25-micron thick lines was then placed on the composite in contact with the photopolymerized butadiene film. The composite was placed in the vacuum chamber which was evacuated to about $10^{-3}$ torr. The composite was then irradiated with the 700-watt mercury lamp for 5 minutes positioned 9 cm. from the substrate. The substrate was then developed in an acetone bath at 25° C. for 30 seconds. There remained a negative pattern of "fixed" film on the copper surface. The substrate was then immersed in a copper etchant for 5 minutes at 25° C. The exposed copper was dissolved producing a negative pattern of the stencil mask on the copper silicon wafer.

EXAMPLE 3

In accordance with the procedure of Example 1, an acetone soluble 1,000-Angstrom thick film from hexachlorobutadiene is formed on an evaporated gold ceramic wafer. A mask is placed in contact with the film and the film is exposed while in vacuum as described in Example 1. The wafer is then developed in acetone, and etched with the gold etchant of Example 1. A second level of gold is then evaporated onto the resulting ceramic-gold-organic film composite. The second gold layer completely covers the residual photopolymerized film. A second soluble photopolymerized film is made on the second gold layer repeating the procedure of Example 1. A multilayer composite is obtained consisting of an upper soluble hexachlorobutadiene film, on top of a gold layer which covers a photoresist on patterned gold in contact with the ceramic wafer. The multilayer composite is again exposed, developed and etched. There is obtained a microelectronic circuit component having dielectric film between a first and second level gold electrodes in the form of a capacitor. The hexachlorobutadiene resist on the upper layer of gold also is retained as an insulating and passivating layer. In addition, hexachlorobutadiene films are used to make multilayer conductor interconnections as follows: a gold layer is patterned as described above, then remaining organic film is pattern-depolymerized in accordance with the previously described method A. N. Wright and R. C. Merrill. A second conducting layer is evaporated onto the gold-organic polymer composite, making electrically conducting contacts at all points where the first gold layer is exposed by the depolymerization of the insulating organic film.

EXAMPLE 4

A sample of aluminum foil was coated with an acetone soluble film from 2,5-dimethyl-2,4-hexadiene by the process of surface photopolymerization using a 700-watt Hg arc lamp. The monomer source was thermostated at 0° C. producing a vapor pressure in the deposition chamber of about 2 torr. The substrate temperature during the deposition was 60° C. After about 15 minutes a 2,500Angstrom film was formed. A stencil mask was placed on the substrate and it was exposed for 10 minutes using the same 700-watt Hg arc lamp positioned about 9 cm. above the substrate. The substrate was then rinsed with a gentle spray of acetone for 15 seconds. Those areas of the film that were shielded from the ultraviolet light were removed by the acetone. A pattern of "fixed" film was produced on the aluminum foil that was a negative of the mask pattern. Capacitance measurements were made on the fixed film employing the mercury drop technique as previously described. The film was found to be continuous and imperforate and exhibited valuable dielectric properties.

We claim:

1. In a method for etching a substrate which comprises (1) effecting the photodeposition of an organic solvent soluble organic film onto the surface of a substrate to produce an organic film-substrate composite, (2) the exposure of portions of the organic solvent soluble organic film to light in the substantial absence of oxygen rendering such exposed portions insoluble in such organic solvent, (3) the treatment of the organic film-substrate composite with organic solvent to effect the removal of soluble organic film, and (4) the etching of the exposed substrate surface with a chemical etchant, the improvement of effecting the deposition of the organic solvent soluble film of step (1) onto the surface of the substrate by photopolymerizing a photopolymerizable organic monomer in vaporous form on the surface of the substrate at a surface temperature below 100° C. utilizing ultraviolet light at a wavelength of from about 1,800 to 3,500 Angstroms.

2. The method of claim 1, utilizing hexachlorobutadiene as the organic monomer.

3. The method of claim 1, utilizing butadiene as the organic monomer.

4. The method of claim 1, employing silicon oxide on silicon as the substrate.

5. The method of claim 1, employing aluminum as the substrate.

6. The method of claim 1, employing copper as the substrate.

7. The method of claim 1, including the removal of organic solvent insoluble organic film from the substrate after the substrate has been etched.

8. The method of claim 7, where the removal of the organic solvent insoluble film is effected by irradiation with ultraviolet light in air.

* * * * *